United States Patent [19]

Garverick et al.

[11] Patent Number: 4,529,895
[45] Date of Patent: Jul. 16, 1985

[54] ACTIVE HIGH BEFORE OPEN THREE STATE INTEGRATED CIRCUIT OUTPUT STAGE

[75] Inventors: Timothy L. Garverick, Santa Clara; Charles P. Carinalli, Sunnyvale, both of Calif.

[73] Assignee: National Semiconductor Corporation, Santa Clara, Calif.

[21] Appl. No.: 452,667

[22] Filed: Dec. 23, 1982

[51] Int. Cl.³ .................... H03K 17/16; H03K 17/28; H03K 19/088
[52] U.S. Cl. .................... 307/473; 307/443; 307/456; 307/592
[58] Field of Search ............... 307/443, 456, 473, 474, 307/475, 246, 592, 601

[56] References Cited

U.S. PATENT DOCUMENTS

| 4,194,131 | 3/1980 | Mrazek et al. | 307/473 |
| 4,329,600 | 5/1982 | Stewart | 307/473 X |
| 4,355,246 | 10/1982 | Usui | 307/473 X |
| 4,449,064 | 5/1984 | Eckert et al. | 307/473 |
| 4,465,945 | 8/1984 | Yin | 307/473 |

Primary Examiner—Stanley D. Miller
Assistant Examiner—D. R. Hudspeth
Attorney, Agent, or Firm—Gail W. Woodward; Paul J. Winters; Michael J. Pollock

[57] ABSTRACT

A three state inverter driver is operated so that its output goes to a logic one briefly just prior to going to its high impedance state when commanded by a disable pulse. This characteristic is useful where a plurality of drivers are employed to operate a DRAM element.

3 Claims, 3 Drawing Figures

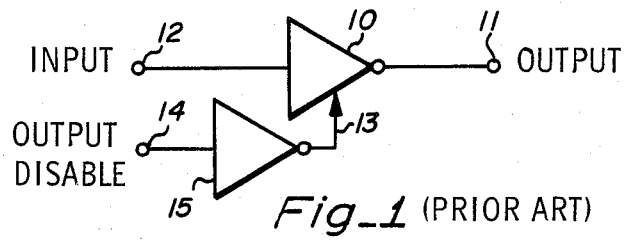
Fig_1 (PRIOR ART)
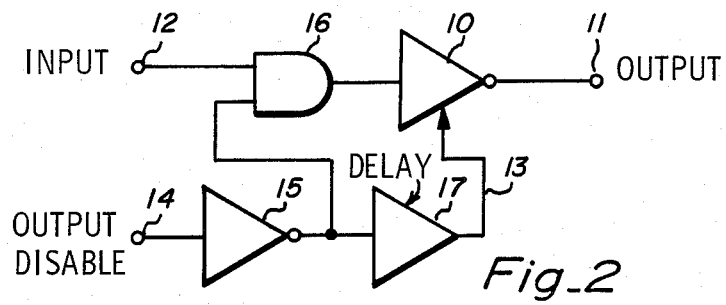
Fig_2
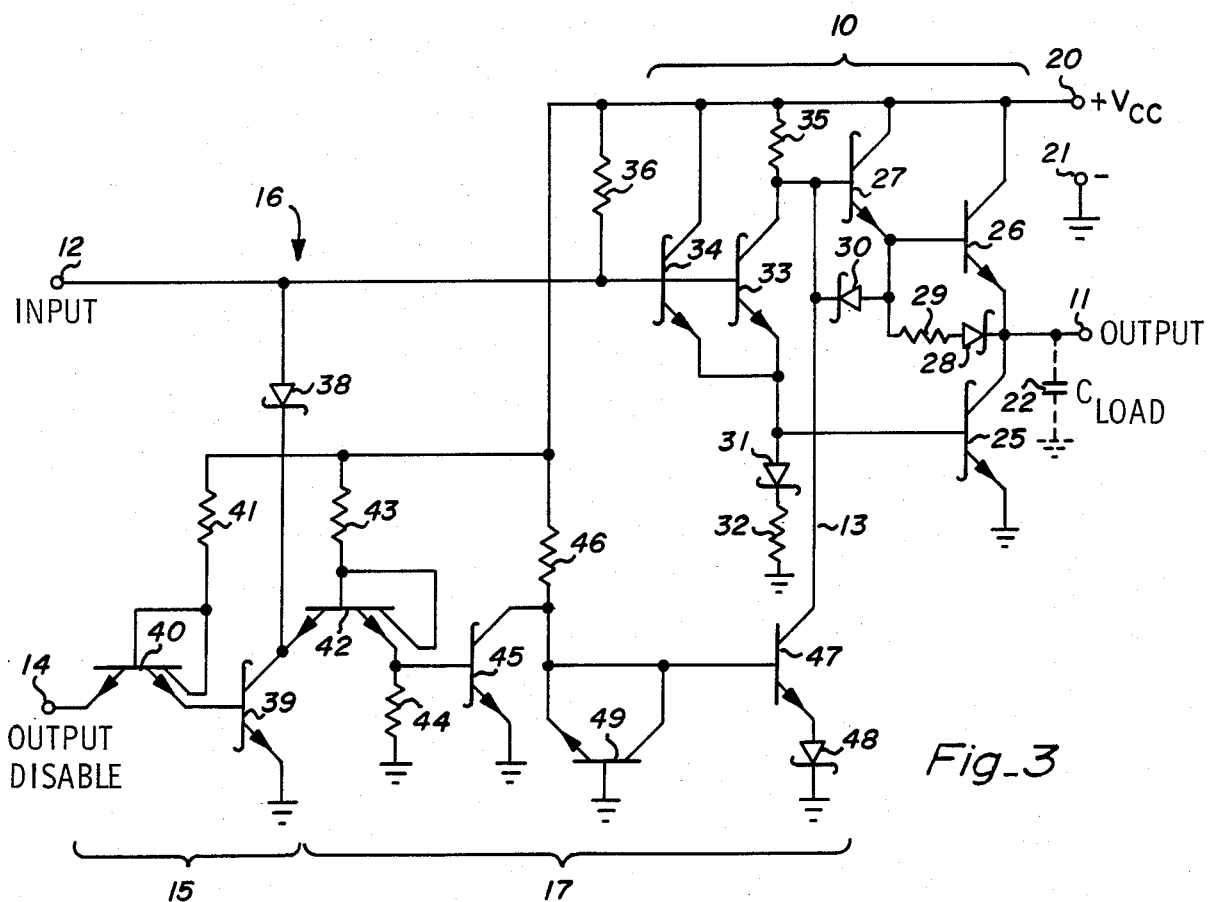
Fig_3

4,529,895

ACTIVE HIGH BEFORE OPEN THREE STATE INTEGRATED CIRCUIT OUTPUT STAGE

BACKGROUND OF THE INVENTION

Three state devices are known in the IC industry as TRI-STATE integrated circuits which is a registered trademark of National Semiconductor Corporation. These are integrated circuit digital logic devices in which the output can float in an open circuit condition as well as assuming a logic zero or one condition. Such a capability is useful where a plurality of logic drivers are coupled in common to a bus in a computer system. The particular driver that is desired to drive the bus is enabled selectively by control circuitry while all of the other drivers are disabled in their floating output condition. Such an arrangement permits coupling as many drivers as desired to a common bus without resorting to decoupling circuitry which adds complexity, reduces drive level, and often acts to slow the computer operation. In the conventional three state integrated circuit devices, the output stage is either active or inactive in response to the state of an enable signal input.

SUMMARY OF THE INVENTION

It is an object of the invention to provide a three state integrated circuit output stage which, just prior to going open or floating, acts to drive the load circuit (bus) to a particular logic state.

It is a further object of the invention to drive a three state integrated circuit output stage to a logic high just prior to disabling to its floating condition.

The circuit to be described is intended primarily for use with dynamic random access memory (DRAM) control systems. In certain memory control applications it is important to keep the access bus high to avoid false access. This is accomplished by driving the three state driver circuit output high just prior to its disabling. This can be accomplished by coupling one input of a two input AND gate between the input of a first inverter gate and its signal source. The other AND gate input is obtained from a second inverter gate which has its input driven by the disable signal. A delay buffer is coupled between the second AND gate input and the first inverter gate disable control input. This means that when the first inverter gate is to be turned off to acheive a floating output it is first driven to a logic one for the delay period, after which it is turned off.

BRIEF DESCRIPTION OF THE DRAWING

FIG. 1 is a block diagram of the prior art three state circuit using a controlled inverter.

FIG. 2 is a block diagram of a three state circuit in which the output goes high prior to going open.

FIG. 3 is a schematic diagram of a bipolar transistor circuit version of the FIG. 2 logic diagram.

DESCRIPTION OF THE PRIOR ART

In the block diagram of FIG. 1 inverter 10 drives output terminal 11 in response to an input at terminal 12 as long as control line 13 is high. This will occur when enable terminal 14 is at a logic zero by virtue of inverter 15. When disable terminal 14 goes high, inverter 15 will shut inverter 10 off so that output 11 floats in a high impedance state. This is the conventional three state circuit operation.

DESCRIPTION OF THE INVENTION

In FIG. 2 the first input of an AND gate 16 is coupled between input terminal 12 and inverter 10. The other AND gate 16 input is driven from the output of inverter 15. As long as terminal 14 is low the second AND gate 16 input will be high and the signal at terminal 12 will be repeated at the input of inverter 10. However when the three state circuit is to be disabled terminal 14 will be driven from low to high so that the second AND gate 16 input will be low and the input to inverter 10 will be a logic zero. This forces output terminal 11 high by the action of inverter 10. Line 13 will remain high and maintain the output of inverter 10 for the delay period of buffer 17. After the delay period has elapsed, the output of buffer 17 will go low and disable inverter 10 so that its output will float. Thus in the circuit of FIG. 2 the output will go to a logic one just prior to going to its high impedance state. Such a condition can be useful in DRAM control where a substantial capacitive load is present due to parallel connected memory devices and printed circuit wiring. The load capacitance is first charged by the driver before the driver goes to its high impedance state.

FIG. 3 is a schematic diagram of a bipolar device implementation of the circuit of FIG. 2. It is to be understood that while a bipolar Schottky, TTL device implementation is shown, other kinds of logic devices, such as MOS or CMOS, can be employed. Where similar elements occur to those in FIG. 2, the same numbers are used. The circuit is operated from a $V_{cc}$ power supply connected + to terminal 20 and − to ground terminal 21. A capacitive load 22 as described above, is denoted by the dashed lines coupled between output terminal 11 and ground.

A conventional low power Schottky inverter 10 is shown existing between input terminal 12 and output terminal 11. A totem pole output stage is made up of current sink transistors 25, current source transistor 26 and Darlington-connected source driver transistor 27. Schottky diode 28 and resistor 29 return the base of transistor 26 to its emitter. When transistor 27 is on its emitter current will drive the base of transistor 26 to turn it on. The voltage drop across diode 28 and resistor 29 is sufficient to ensure conduction in transistor 26. However when transistor 27 is off diode 28 and resistor 29 will pull the base of transistor 26 low so as to turn it off.

Schottky diode 30 returns the base of transistors 27 to its emitter and is poled to be conductve when the base of transistor 27 is low. Diode 30 is present to pull the base of transistor 26 low when the base of transistor 27 is pulled low in the output disable state or when a logic zero output is desired. Schottky diode 31 and resistor 32 return the base of transistor 25 to ground. When transistors 33 and 34 are on the voltage drop across diode 31 and resistor 32 will turn transistor 25 on. When transistors 33 and 34 are off diode 31 and resistor 33 will pull the base of transistor 25 low and turn it off.

Phase splitter transistor 33 drives the Darlington-connected current source driver transistor 27 out of phase with current sink transistor 25. Emitter follower transistor 34 acts to boost the turn on current drive in transistor 25. When transistor 33 conducts the voltage drop across resistor 35 pulls the base of transistor 27 low and truns it off. When transistor 27 is off transistor 26 will also be off. In the absence of any input at terminal 12 resistor 36 will pull the base of transistor 33 high so that the output at terminal 11 is normally low, thereby causing output terminal 11 to act as a current sink.

When input terminal 12 is pulled low, due to a logic zero, transistor 33 will be turned off and the current in resistor 35 will be diverted into the base of transistor 27 thereby turning the current sourcing part of the output stage on. Using this characteristic in conjunction with Schottky diode 38 creates AND gate 16, the operation of which will now be described.

Transistor 39 in combination with dual emitter transistor 40 makes up inverter 15. Resistor 41 acts to bias transistor 39 on when disable terminal 14 is either open or high. When disable terminal 14 is low, the current in resistor 41 will flow to ground through the left hand emitter of transistor 40. There will be insufficient bias to turn transistor 39 on for this condition. Terminal 14 will have to rise above one $V_{BE}$ to turn transistor 39 on. Below this threshold the potential applied to Schottky diode 38 will cause it to be non-conductive and any signals at input terminal 12 will be directly coupled to the bases of transistors 33 and 34. When the level of terminal 14 exceeds the above-mentioned threshold (goes high) transistor 39 will turn on and pull the lower end of Schottky diode 38 low so that it will conduct the current normally flowing in resistor 36. This will turn transistors 33 and 34 off. This removes the drive current to transistor 25 and diode 31 along with resistor 32 will pull the base of transistor 25 low so that it too is turned off. Thus when transistor 39 is on, output terminal 11 will go high. This means that diode 38 in combination with the normal operation of inverter 10 will create AND gate 16.

Transistor 39 also drives buffer 17 by applying its output signal to the emitter of diode connected transistor 42 which is also operated as a diode pair. When transistor 39 is on the current flowing in resistor 43 is shunted to ground through the left hand emitter of transistor 42 and through the collector of transistor 39. At the base of transistor 42 the threshold of conduction in transistor 45 is $2V_{BE}$. When transistor 39 is on there is close to zero current in resistor 44 so that the base of transistor 45 is below its conduction threshold. However, when transistor 39 turns off the current in resistor 43 is diverted to resistor 44 and the base of transistor 45 which turns on. This conducts the current in resistor 46 to ground thereby pulling the base of transistor 47 low so as to turn it off. Under this latter condition inverter 10 will function normally.

When the disable signal at terminal 14 goes high, transistor 39 turns on which turns transistor 45 off. Under this condition, the current flowing in resistor 46 is forced into the base of transistor 47 which turns it on. Thus the current normally flowing in resistor 35 will flow through the collector of transistor 47 and then through Schottky diode 48 to ground. This action pulls the base of transistor 27 low and turns it off and this action removes the base current to transistor 26 so that diode 28 and resistor 29 pull the base of transistor 26 low so as to turn it off and thereby terminate the sourcing of current to output terminal 11. However, the foregoing action cannot occur until transistor 47 turns on and this action is delayed.

It will be noted that buffer 17 includes a diode connected transistor 49 connected between the base of transistor 47 and ground. When reverse biased this diode connected transistor will display substantial capacitance that must be charged to turn transistor 47 on. Under the condition where terminal 14 is low so as to turn transistor 39 off transistor 45 will be on as described above. This will substantially discharge the capacitance of diode connected transistor 49. Then when the disable pulse turns transistor 45 off, the current flowing in resistor 46 will charge the capacitance of diode connected transistor 49 and this results in a rising voltage ramp at the base of transistor 47. The threshold of conduction in transistor 47 is about 1.2 volt at 300° K. due to the presence of diode 48. The time delay in seconds will approximate:

$$R_{46} \times C_{49} \ln \frac{V_{cc}}{V_{cc} - 1.2}$$

where $R_{46}$ is the value of resistor 46 in ohms, $C_{49}$ is the capacitance of diode connected transistor 49 in Farads. The value of $$\ln \frac{V_{cc}}{V_{cc} - 1.2}$$

is about 0.27 for a 5-volt supply. In a typical circuit application the delay will be about 30 nanoseconds which will accommodate charging a wide range of capacitive loads. A typical load can be on the order of 500 pf.

In view of the foregoing, it will be seen that when the signal at terminal 14 goes high the totem pole output stage first reverts to its current source mode (a logic one output) and then shortly thereafter goes into its high impedance mode. In the application where a number of such devices will be commmonly coupled to a line that is common to DRAM circuits, the disable action is accompanied by a preceding "high" condition.

The invention has been described and a detailed implementation using Schottky TTL circuitry has been set forth. Clearly the same functions could be implemented using other kinds of circuits, for example NMOS, PMOS, or CMOS. Upon reading the foregoing description other alternatives and equivalents, within the spirit and intent of the invention, will occur to a person skilled in the art. Accordingly, it is intended that the scope of the invention be limited only by the following claims.

I claim:

1. In a three state output logic circuit comprising an amplifier with an output stage responsive to input logic and control means for driving said output stage to a high impedance state in response to a disabling pulse, the improvement comprising:

an inverting amplifier coupled to receive said disabling pulse;

a delay buffer coupled in cascade with said inverting amplifier; and

AND gate means coupled to control said output stage and having a first input for receiving said input logic and a second input coupled to receive the output of said inverting amplifier wherein said output stage is driven to a logic one state for a predetermined time interval following the application of said disabling pulse.

2. A three state logic circuit having an output stage coupled to drive an output terminal to one of three conditions, a logic one, a logic zero, and a floating high impedance condition, said floating condition being responsive to a disabling pulse and being preceded by a predetermined interval of logic one condition in response to receiving said disable pulse, said circuit comprising:
an input terminal for receiving logic input signals;
means for driving said output stage in response to said logic input signals;
means for disabling said output stage;
AND gate means having an output coupled to said means for driving said output stage, a first input coupled to said logic input terminal, and a second input;
an inverter having an input coupled to receive said disable pulse, and an output coupled to said second input of said AND gate means; and
a delay buffer having an input coupled to said output of said inverter and an output coupled to said means for disabling said output stage.

3. The circuit of claim 2 wherein said output stage comprises a pull up element and a pull down element arranged in a totem pole configuration and a phase splitter is coupled to drive said pull up element out of phase with said pull down element in response to said output of said AND gate means.

* * * * *